(12) United States Patent
Holt et al.

(10) Patent No.: US 11,605,741 B2
(45) Date of Patent: Mar. 14, 2023

(54) METHODS OF FORMING DOPED SILICIDE POWER DEVICES

(71) Applicant: Applied Materials, Inc., Santa Clara, CA (US)

(72) Inventors: Joshua S. Holt, Santa Clara, CA (US); Lan Yu, Albany, NY (US); Tyler Sherwood, Fonda, NY (US); Archana Kumar, Mountain View, CA (US); Nicolas Louis Gabriel Breil, Alviso, CA (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 183 days.

(21) Appl. No.: 17/102,148

(22) Filed: Nov. 23, 2020

(65) Prior Publication Data
US 2022/0165574 A1 May 26, 2022

(51) Int. Cl.
| | | |
|---|---|---|
| *H01L 29/872* | (2006.01) | |
| *H01L 21/28* | (2006.01) | |
| *H01L 29/45* | (2006.01) | |
| *H01L 29/861* | (2006.01) | |
| *H01L 29/66* | (2006.01) | |
| *H01L 29/47* | (2006.01) | |

(52) U.S. Cl.
CPC ...... *H01L 29/872* (2013.01); *H01L 21/28052* (2013.01); *H01L 29/456* (2013.01); *H01L 29/47* (2013.01); *H01L 29/6609* (2013.01); *H01L 29/66143* (2013.01); *H01L 29/861* (2013.01)

(58) Field of Classification Search
CPC ............. H01L 21/28052; H01L 29/456; H01L 29/6609; H01L 29/861; H01L 29/47; H01L 29/66143; H01L 29/872
See application file for complete search history.

(56) References Cited

U.S. PATENT DOCUMENTS

2003/0062585 A1* 4/2003 Andoh ................ H01L 27/0814
257/471

* cited by examiner

*Primary Examiner* — Jose R Diaz
(74) *Attorney, Agent, or Firm* — Kilpatrick Townsend & Stockton LLP

(57) ABSTRACT

Exemplary methods of forming a semiconductor structure may include forming a layer of metal on a semiconductor substrate. The layer of metal may extend along a first surface of the semiconductor substrate. The semiconductor substrate may be or include silicon. The methods may include performing an anneal to produce a metal silicide. The methods may include implanting ions in the metal silicide to increase a barrier height over 0.65 V.

20 Claims, 4 Drawing Sheets

METHODS OF FORMING DOPED SILICIDE POWER DEVICES

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Exemplary methods of forming a semiconductor structure may include forming a layer of metal on a semiconductor substrate. The layer of metal may extend along a first surface of the semiconductor substrate. The semiconductor substrate may be or include silicon. The methods may include performing an anneal to produce a metal silicide. The methods may include implanting ions in the metal silicide to increase a barrier height over 0.65 V.

In some embodiments, the methods may include patterning the layer of titanium on the semiconductor substrate to form a region of titanium overlying the first surface of the semiconductor substrate. The methods may include, subsequent the implanting, performing an anneal to activate the ions. The methods may include forming an anode contact on the titanium silicide. The methods may include producing a diode from the semiconductor structure. The methods may include measuring a switching speed of the diode to be less than or about 1 µs. The diode may be characterized by a cut-in voltage of less than or about 500 mV. The semiconductor substrate may be or include n– silicon. The barrier height may be increased to greater than or about 0.85 V. The ions may be or include boron.

Some embodiments of the present technology may encompass semiconductor structures. The structures may include a substrate including n– silicon. The substrate may include a cathode connection. The structures may include a region of metal silicide formed in the substrate. The region of metal silicide may be characterized by implanted ions of boron, phosphorus, or arsenic. The region of metal silicide may be characterized by a barrier height of greater than or about 0.8 V. The structures may include an anode connection overlying the region of metal silicide.

In some embodiments, the semiconductor structure may be characterized by a cut-in voltage of less than or about 500 mV. The region of metal silicide may be or include a refractory metal. The region of metal silicide may be characterized by an ion implantation dosage of less than or about $1 \times 10^{20}$ ions/cm$^3$. The semiconductor structure may be characterized by a switching speed of less than or about 1 µs.

Some embodiments of the present technology may encompass methods of forming a semiconductor structure. The methods may include forming a layer of a refractory metal on a semiconductor substrate. The layer may extend along a first surface of the semiconductor substrate. The semiconductor substrate may be or include silicon. The methods may include patterning the layer with an etch process selective to the refractory metal relative to silicon. The methods may include performing an anneal to produce a metal silicide. The methods may include implanting ions in the metal silicide to increase a barrier height of the metal silicide. The methods may include annealing the metal silicide to activate the ions.

In some embodiments, the barrier height may be increased to greater than or about 0.85 V. The ions may be or include boron. The methods may include forming an anode contact on the metal silicide. The methods may include producing a diode from the semiconductor structure. The methods may include measuring a switching speed of the diode to be less than or about 1 µs. The diode may be characterized by a cut-in voltage of less than or about 500 mV.

Such technology may provide numerous benefits over conventional systems and techniques. For example, the processes may produce devices with tunable leakage characteristics. Additionally, the processes may allow formation of a contact layer, such as a Schottky contact layer, without the need for noble metal etching. By utilizing other metals, including refractory metals, the present technology may also afford more cost effective devices. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
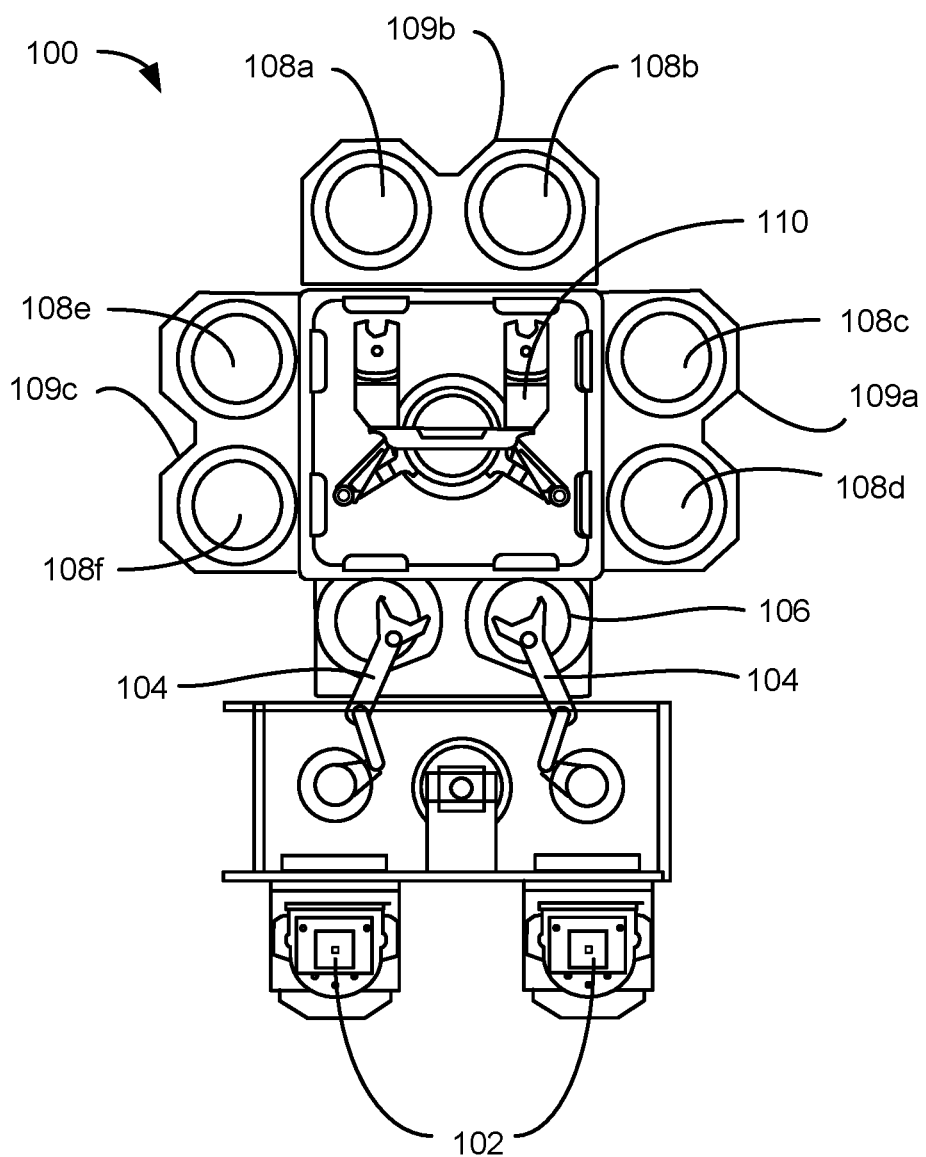
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, uniformity, material quality, process control, and repeatability are becoming more challenging from process to process. To continue to improve device performance at reduced scale, alternative films and processes are being investigated for additional performance improvements relative to conventional devices.

For example, in power devices, including power diodes, many structures are formed over silicon carbide or gallium nitride, which may be prohibitively expensive. However, to use alternative materials, such as silicon, as a device substrate for high-power devices including at or above 650 V, charge balancing becomes more difficult to achieve between various regions of the device. Additionally, many power devices, such as Schottky diodes, may use platinum silicide as the Schottky contact. The formation process for the contact may include etching platinum metal, which may require the use of heated aqua regia, for example. The etchant may require a very controlled environment, which may not be conducive to front-end processing setups. Additionally, because of the reactivity, the etchant may also cause damage to other exposed materials, as well as to the underlying substrate. However, because of the higher barrier height afforded by platinum, many conventional technologies are limited to these materials.

The present technology may overcome these issues by forming a doped metal contact, which may have a tuned barrier height, while maintaining fast switching, which may be characteristic of Schottky diodes. By controlling the implantation process to limit effects on device switching, the present technology may be able to reduce current leakage from the device produced, while also maintaining faster switching speeds. Although the remaining disclosure will routinely identify specific structures, such as diodes, for which the present structures and methods may be employed, it will be readily understood that the systems and methods are equally applicable to any number of structures and devices that may benefit from these materials and processes during semiconductor processing, such as structures including transistors or other devices. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
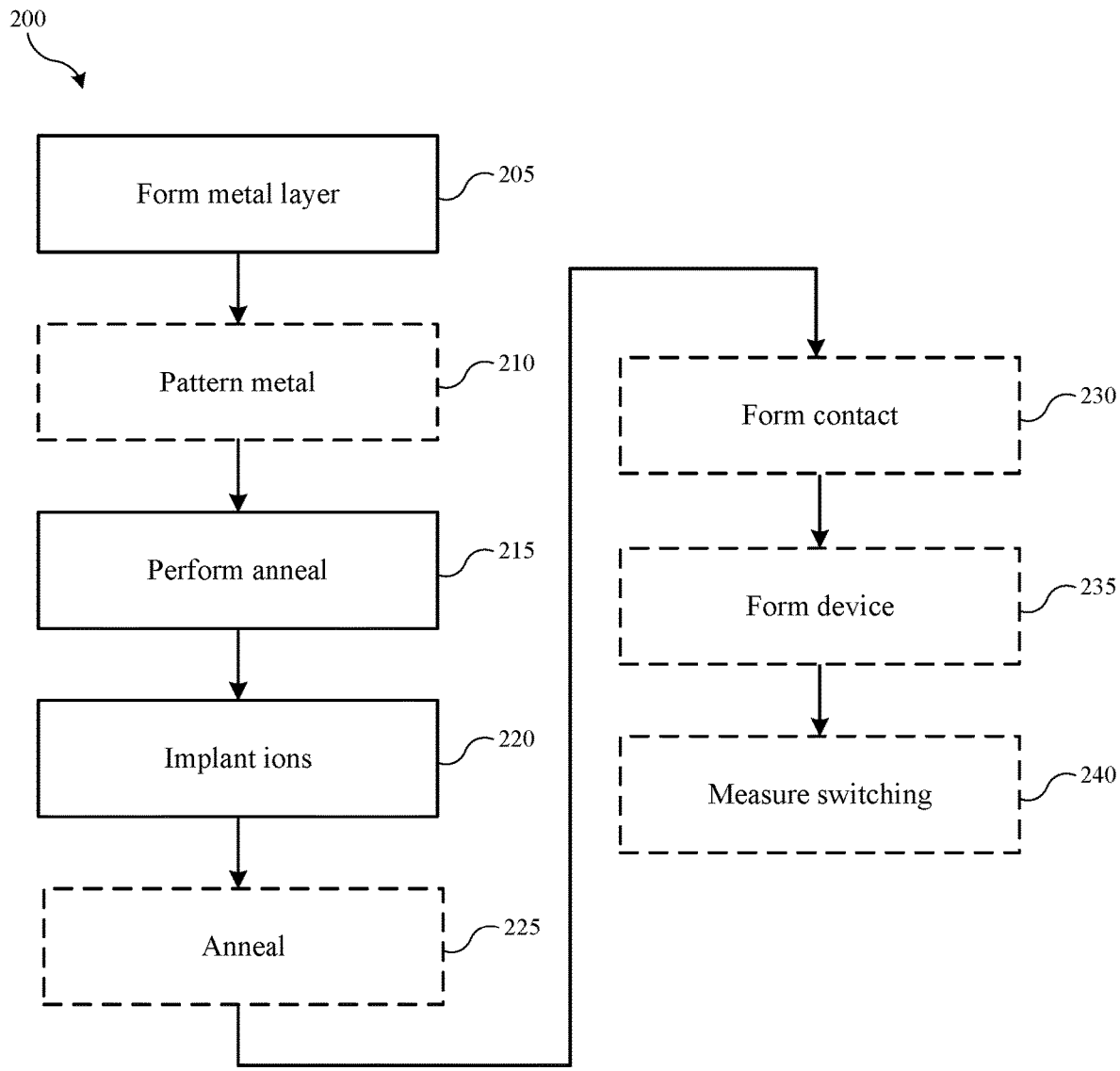
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3E, the illustrations of which will be described in conjunction with the operations of method 200. It is to be understood that FIG. 3 illustrates only partial schematic views with limited details, and in some embodiments a substrate may contain any number of semiconductor sections having aspects as illustrated in the figures, as well as alternative structural aspects that may still benefit from any of the aspects of the present technology.

Figure 3A:
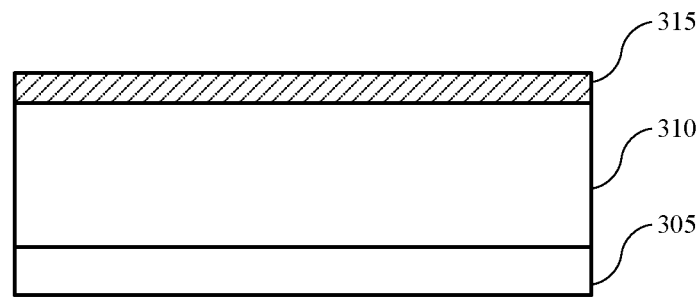
FIGS. 3A-3E show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure.

In some embodiments, substrate 305 may be or include silicon, which may be doped by any number of materials, as well as silicon-containing or gallium-containing materials. The doping may be n+ or p+ in some embodiments, and the silicon may be formed or grown by any number of techniques. Additionally, in embodiments, one or more doped regions may be included in the substrate, or grown on the substrate. For example, an additional semiconductor layer 310 may be formed overlying or as a portion of the substrate, which may be used in producing a metal-semiconductor junction, as will be described further below. As one example, in some embodiments semiconductor layer 310 may be an n− silicon epitaxially grown over the substrate, or included on the substrate. This semiconductor layer 310 may also include additional regions, such as an n+ doped region, which may be used in some embodiments as will be noted below, such as for a lateral diode structure.

One or more material layers may be formed over some or all of semiconductor layer 310 in operations according to some embodiments of the present technology. For example, formation of the metal-semiconductor junction, or Schottky contact, may be performed with one or more formation steps. At operation 205, a metal layer may be formed overlying the substrate. As illustrated in FIG. 3A, layer 315 may be formed over the substrate. The metal may be any number of transition metals, and in some embodiments may be a refractory metal, and may be or include titanium, tantalum, molybdenum, tungsten, palladium, or other metals or materials that may be used to form a contact structure. In some embodiments, the metal may be selected to form a threshold barrier height in a silicide formed as will be noted below. The layer 315 may extend across a first surface of the substrate, and may be subsequently patterned to produce a region of metal material over the substrate.

The metal material may be used to form a contact or junction on the substrate, and may be patterned to a specific region or section of the substrate, such as for an anode connection, as one non-limiting example. At optional operation 210, metal layer 315 may be patterned or etched to form a region of the metal overlying the first surface of the substrate. Unlike some conventional devices utilizing platinum, by utilizing one or more of the metals noted above, selective etch processes may be performed to limit effects on any other materials exposed on the substrate, as well as any damage to the substrate itself once exposed. For example, where titanium may be the metal, an etch process, which may be wet or dry, or plasma enhanced, may be performed to selectively remove titanium relative to silicon or other materials. This may allow specific patterning of the titanium from portions of the substrate.

Figure 3B:
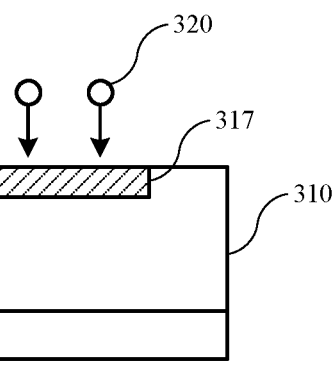

Once patterned, an anneal process may be performed at operation 215 to promote interdiffusion of the metal with the substrate material, which may form a region of silicide on the substrate. As one non-limiting example in which the metal is titanium, the anneal may be performed to form a region of titanium silicide on the substrate where an anode contact may be formed. As illustrated in FIG. 3B, the region of silicide 317 may extend within the substrate, and may be characterized by a thickness of less than or about 100 nm. Additionally, in some embodiments the silicide layer may be characterized by a thickness less than or about 80 nm, less than or about 70 nm, less than or about 60 nm, less than or about 50 nm, less than or about 40 nm, less than or about 30 nm, less than or about 20 nm, or less. The formation may produce a Schottky barrier or contact, which may be characterized by a barrier height. A higher barrier height may lower leakage current in the off state of the device.

For power devices, a low leakage current may be needed when high voltage is involved, and thus a higher barrier height may reduce current leakage. Although pn-diodes may be characterized by low leakage current, the switching speed of the device is not conducive to power devices for which switching speed may be more important to operation. A benefit to platinum as the junction metal is that it may produce a relatively high barrier height of about 0.85 V. The alternative metals may produce a lower barrier height in some embodiments. For example, titanium may produce a barrier height of about 0.65 V, which may be characterized by higher leakage current. Accordingly, in some embodiments the methods may include increasing the barrier height of the region of silicide.

At operation 220, the methods may include implanting ions in the metal silicide to increase the barrier height. As illustrated in FIG. 3B, ions 320 may be directed at the silicide material to be implanted within the structure. Depending on the metal used in the silicide, the amount of implantation may be adjusted to produce a target barrier height. However, over-inclusion of ions may impact switching speed as will be discussed further below. Accordingly, in some embodiments the metal silicide may be characterized by a baseline barrier height prior to ion incorporation of greater than or about 0.3 V, and may be characterized by a baseline barrier height of greater than or about 0.35 V, greater than or about 0.40 V, greater than or about 0.45 V, greater than or about 0.50 V, greater than or about 0.55 V, greater than or about 0.60 V, greater than or about 0.65 V, greater than or about 0.70 V, greater than or about 0.75 V, greater than or about 0.80 V, or higher. Although any number of materials may be used, the base material silicide may be characterized by a threshold barrier height to control the amount of dopant needed to sufficiently raise the barrier height, which may affect switching speed as discussed below.

Figure 3C:
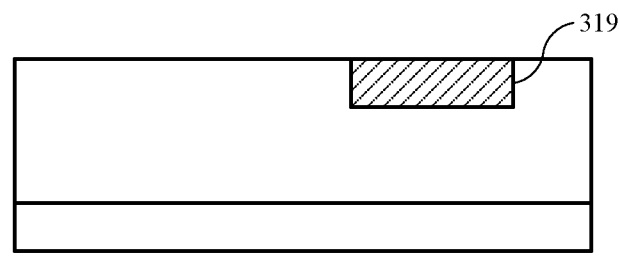

Subsequent the implantation, an anneal may be performed at optional operation 225, which may activate the ions. The anneal may be a high temperature anneal to cure the crystalline structure producing a doped crystalline structure incorporating the ions. The incorporated ions may increase the barrier height of the silicide material, and as shown in FIG. 3C, may also increase the thickness of the silicide, where region of silicide 319 may be characterized by an increased thickness after implantation. For example, in some embodiments once the ion incorporation has occurred, the barrier height may be greater than or about 0.80 V, and may be greater than or about 0.85 V, greater than or about 0.90 V, greater than or about 0.95 V, or higher. The implantation and anneal may increase the junction material thickness, which may be characterized by a thickness after implantation of greater than or about 100 nm, and may be characterized by a thickness of greater than or about 150 nm, greater than or about 200 nm, greater than or about 250 nm, greater than or about 300 nm, greater than or about 350 nm, greater than or about 400 nm, greater than or about 450 nm, greater than or about 500 nm, or more.

The ion implantation may be performed with any number of implantation techniques including beamline ion implantation, plasma doping ion implantation, or any other implant technique. The ion implantation may utilize ions produced from any number of precursors. For example, precursors encompassed by embodiments of the present technology may include boron, phosphorus, arsenic, or any other material that may be used to modify the barrier height of the silicide materials. The dosing may be performed at dose levels greater than or about $1e13$ ions/cm$^2$, and may be performed at dose levels greater than or about $1e14$ ions/cm$^2$, greater than or about $1e15$ ions/cm$^2$, greater than or about $1e16$ ions/cm$^2$, greater than or about $1e17$ ions/cm$^2$, greater than or about $1e18$ ions/cm$^2$, or higher. By increasing the implantation, a barrier height may be formed that meets or exceeds platinum-based materials, which may produce even lower leakage current from the device. However, when ion implantation exceeds a threshold, device switching speed may be reduced. For example, based on the concentration of ion inclusion in the silicide, the diode formed may degrade from a Schottky diode to a pn-diode, which may limit effectiveness of a power device formed. Accordingly, in some embodiments, the dosing may be performed at dose levels less than or about $1e20$ ions/cm$^3$, and may be performed at dose levels less than or about $1e19$ ions/cm$^3$, less than or about $1e18$ ions/cm$^3$, less than or about $1e17$ ions/cm$^3$, or less. By controlling the dose level, switching speeds may be maintained sufficiently high, as will be described below.

Figure 3D:
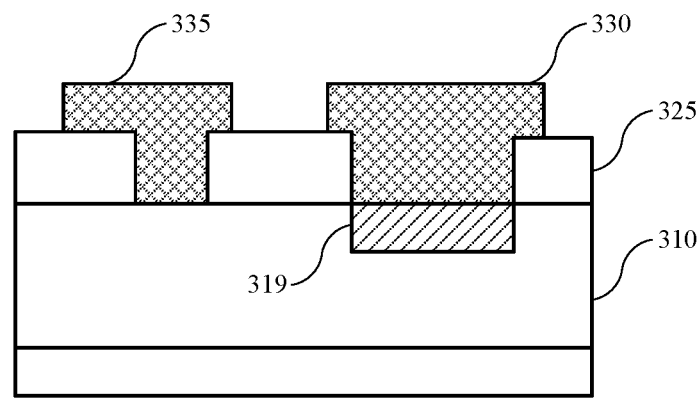

In some embodiments, additional fabrication may be performed subsequent the ion implantation. For example, in some embodiments one or more contacts may be formed at operation 230, which may lead to the production of a device at operation 235, such as a power device in some embodiments, including a Schottky diode. As shown in FIG. 3D, the structure may include one or more insulation materials 325, which may include any number of layers including dielectric or functional materials for device operations. One or more layers of materials 325 may include silicon dioxide, aluminum oxide, or any other materials or passivation layers that may be included in power devices. Subsequent patterning, an anode contact 330 may be formed over the silicide material 319, or barrier layer, and which may be a front metal or conductive material used for device operation. Any number of metals or conductive materials may be used to form the anode contact 330. A cathode contact or other ohmic contact may be included on the device in one or more regions. For example, embodiments of the present technology may encompass both vertical diode formation as well as lateral diode formation. Accordingly, in some embodiments an additional contact may be made laterally offset from the anode contact, as shown by cathode 335, and which may be used to operate the device as a diode.

Figure 3E:
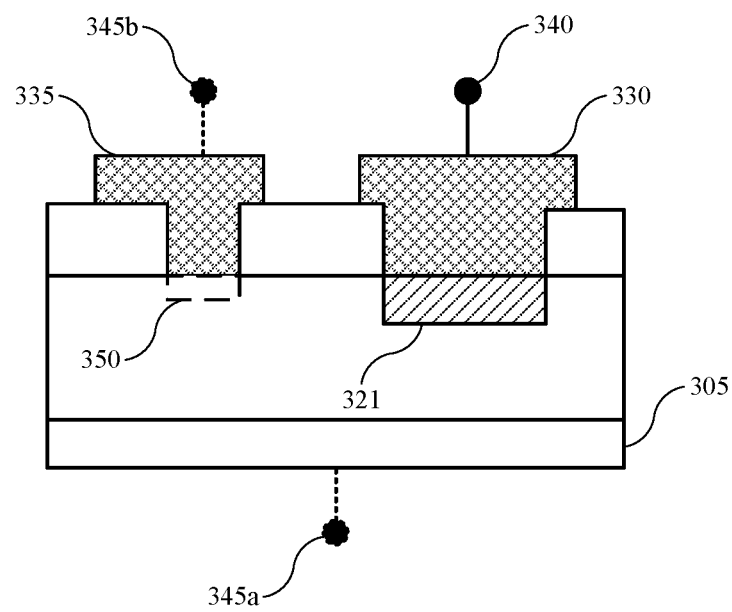

Once the device has been fabricated, in some embodiments optional testing may be performed to determine whether the doping has been controlled to maintain Schottky diode switching behavior, which may facilitate operation as a power device. As illustrated in FIG. 3E, the structure or device produced may be operated as a diode to determine switching function. FIG. 3E shows optional components on a single device, which may be operated in one or more ways, and with or without inclusion of all materials in some devices according to embodiments of the present technology. For example, anode 330 may be biased high at contact 340. In a vertical diode structure, an ohmic contact may be included on a backside of substrate 305, and which may be biased low at contact 345a to produce a diode across barrier 321 formed of the metal silicide material. Additionally, in some embodiments, a lateral diode structure may be formed and cathode 335 may be biased low at contact 345b to produce a diode across the barrier 321. In such a configuration, an additional highly doped region 350, which may also be n+, may be formed in contact with the cathode contact. During operation, either contact 345 may be floated relative to the cathode, or the contact may not be included in less structured configurations.

Transient currents may be measured in operation of the device to measure switching speed of the diode at optional operation 240. For example, as noted previously, increased dopant concentration may reduce switching speed in some embodiments, which may produce a pn-diode instead of a Schottky diode. Accordingly, the current measurements may be performed to ensure the device is characterized by a switching speed of less than or about 1 μs, and may be characterized by a switching speed of less than or about 900 ns, less than or about 800 ns, less than or about 700 ns, less than or about 600 ns, less than or about 500 ns, less than or about 400 ns, less than or about 300 ns, less than or about 200 ns, less than or about 100 ns, or less. Additionally, operation may be performed to ensure that the diode is characterized by a cut-in or turn-on voltage of less than or about 500 mV, and may be characterized by a forward voltage of less than or about 400 mV, less than or about 300 mV, less than or about 200 mV, or less. Consequently, the present technology may produce Schottky diodes with more cost effective and more easily manufactured materials. Additionally, the present technology may allow tuning of characteristics of the structure to produce devices characterized by leakage currents and other properties that can be tailored to specific applications.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a contact" includes a plurality of such contacts, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure comprising:
    a substrate comprising n-silicon, wherein the substrate comprises a cathode connection;
    a region of metal silicide formed in the substrate, wherein the region of metal silicide is characterized by implanted ions of boron, phosphorus, or arsenic, wherein the region of metal silicide is characterized by a barrier height of greater than or about 0.8 V, and wherein the metal silicide is characterized by an ion implantation dosage of greater than $1 \times 10^{15}$ ions/cm$^3$; and
    an anode connection overlying the region of metal silicide.

2. The semiconductor structure of claim 1, wherein the semiconductor structure is characterized by a cut-in voltage of less than or about 500 mV.

3. The semiconductor structure of claim 1, wherein the region of metal silicide comprises a refractory metal.

4. The semiconductor structure of claim 1, wherein the semiconductor structure is characterized by a switching speed of less than or about 1 µs.

5. A method of forming a semiconductor structure, the method comprising:
    forming a layer of titanium on a semiconductor substrate, wherein the layer of titanium extends along a first surface of the semiconductor substrate, and wherein the semiconductor substrate comprises silicon;
    performing an anneal to produce titanium silicide; and
    implanting ions in the titanium silicide to increase a barrier height over 0.65 V, wherein the titanium silicide is characterized by an ion implantation dosage of greater than $1 \times 10^{15}$ ions/cm$^3$.

6. The method of forming a semiconductor structure of claim 5, further comprising:
    patterning the layer of titanium on the semiconductor substrate to form a region of titanium overlying the first surface of the semiconductor substrate.

7. The method of forming a semiconductor structure of claim 5, further comprising:
    subsequent the implanting, performing an anneal to activate the ions.

8. The method of forming a semiconductor structure of claim 5, further comprising:
    forming an anode contact on the titanium silicide; and
    producing a diode from the semiconductor structure.

9. The method of forming a semiconductor structure of claim 8, further comprising:
    measuring a switching speed of the diode to be less than or about 1 µs.

10. The method of forming a semiconductor structure of claim 8, wherein the diode is characterized by a cut-in voltage of less than or about 500 mV.

11. The method of forming a semiconductor structure of claim 5, wherein the semiconductor substrate comprises n-silicon.

12. The method of forming a semiconductor structure of claim 5, wherein the barrier height is increased to greater than or about 0.85 V.

13. The method of forming a semiconductor structure of claim 5, wherein the ions comprise boron.

14. A method of forming a semiconductor structure, the method comprising:
    forming a layer of a refractory metal on a semiconductor substrate, wherein the layer extends along a first surface of the semiconductor substrate, and wherein the semiconductor substrate comprises silicon;
    patterning the layer with an etch process selective to the refractory metal relative to silicon;
    performing an anneal to produce a metal silicide;
    implanting ions in the metal silicide to increase a barrier height of the metal silicide, wherein the metal silicide is characterized by an ion implantation dosage of greater than $1 \times 10^{15}$ ions/cm$^3$; and
    annealing the metal silicide to activate the ions.

15. The method of forming a semiconductor structure of claim 14, wherein the barrier height is increased to greater than or about 0.85 V.

16. The method of forming a semiconductor structure of claim 14, wherein the ions comprise boron.

17. The method of forming a semiconductor structure of claim 14, further comprising:
    forming an anode contact on the metal silicide; and
    producing a diode from the semiconductor structure.

18. The method of forming a semiconductor structure of claim 17, further comprising:
    measuring a switching speed of the diode to be less than or about 1 µs.

19. The method of forming a semiconductor structure of claim 17, wherein the diode is characterized by a cut-in voltage of less than or about 500 mV.

20. The method of forming a semiconductor structure of claim 14, wherein the metal silicide is characterized by an ion implantation dosage of greater than $1 \times 10^{15}$ ions/cm$^3$ and less than or about $1 \times 10^{20}$ ions/cm$^3$.

* * * * *